United States Patent
DeLamielleure et al.

(10) Patent No.: US 11,577,988 B2
(45) Date of Patent: Feb. 14, 2023

(54) BOROSILICATE GLASSES WITH LOW ALKALI CONTENT

(71) Applicant: CORNING INCORPORATED, Corning, NY (US)

(72) Inventors: Megan Aurora DeLamielleure, Corning, NY (US); John Christopher Mauro, Boalsburg, PA (US); Charlene Marie Smith, Corning, NY (US); Liying Zhang, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 733 days.

(21) Appl. No.: 16/425,431

(22) Filed: May 29, 2019

(65) Prior Publication Data
US 2019/0276350 A1    Sep. 12, 2019

Related U.S. Application Data

(62) Division of application No. 15/384,687, filed on Dec. 20, 2016, now Pat. No. 10,329,186.

(60) Provisional application No. 62/270,256, filed on Dec. 21, 2015.

(51) Int. Cl.
| | | |
|---|---|---|
| *C03C 8/02* | (2006.01) | |
| *C03C 3/091* | (2006.01) | |
| *B32B 17/06* | (2006.01) | |
| *C03C 3/093* | (2006.01) | |
| *H05K 5/00* | (2006.01) | |
| *H05K 5/03* | (2006.01) | |

(52) U.S. Cl.
CPC .............. *C03C 8/02* (2013.01); *B32B 17/06* (2013.01); *C03C 3/091* (2013.01); *C03C 3/093* (2013.01); *H05K 5/0017* (2013.01); *H05K 5/03* (2013.01); *B32B 2457/20* (2013.01); *C03C 2207/00* (2013.01)

(58) Field of Classification Search
CPC ........... C03C 3/091; C03C 3/093; C03C 8/02; C03C 2207/00; B32B 17/06; B32B 2457/20; H05K 5/0017; H05K 5/03
See application file for complete search history.

(56) References Cited

U.S. PATENT DOCUMENTS

| | | | | |
|---|---|---|---|---|
| 4,214,886 A ‡ | 7/1980 | Shay | ...................... | C03B 17/02 65/121 |
| 4,788,165 A ‡ | 11/1988 | Fong | ...................... | C03C 3/091 |
| 4,824,806 A ‡ | 4/1989 | Yokoi | ...................... | C03C 13/00 501/35 |
| 5,958,808 A ‡ | 9/1999 | Mori | ...................... | C03C 3/091 501/38 |
| 6,309,990 B2 ‡ | 10/2001 | Tamura | .................... | C03C 13/00 501/35 |
| 6,846,761 B2 ‡ | 1/2005 | Tamura | .................... | C03C 3/091 501/35 |
| 7,763,559 B2 ‡ | 7/2010 | Kurachi | .................... | C03C 3/091 501/66 |
| 7,829,490 B2 | 11/2010 | Li et al. | | |
| 8,670,182 B2 ‡ | 3/2014 | Tanida | ...................... | C03C 3/19 359/59 |
| 8,679,993 B2 ‡ | 3/2014 | Sawanoi | .................. | C03C 3/095 501/35 |
| 2013/0135745 A1 ‡ | 5/2013 | Tanida | ...................... | C03C 3/19 359/59 |
| 2014/0140299 A1 | 5/2014 | Ellison et al. | | |
| 2014/0366581 A1 | 12/2014 | Tokunaga et al. | | |
| 2015/0051060 A1 ‡ | 2/2015 | Ellison | .................... | C03C 3/093 501/37 |
| 2015/0140299 A1 ‡ | 5/2015 | Ellison | .................... | B32B 17/00 428/21 |

(Continued)

FOREIGN PATENT DOCUMENTS

| | | | | |
|---|---|---|---|---|
| AU | 2011101310 A4 ‡ | 11/2011 | | |
| CN | 103025675 A | 4/2013 | | |
| CN | 103534216 A ‡ | 1/2014 | | |
| CN | 103910487 A | 7/2014 | | |
| IN | 20110239013 | ‡ | 6/2012 | |
| IN | 201102390 | | 3/2013 | |
| JP | 9002839 | ‡ | 1/1997 | |
| JP | 10167759 | ‡ | 6/1998 | |
| JP | 10167759 A | ‡ | 6/1998 | ............ C03C 13/00 |
| JP | 1998167759 A | | 6/1998 | |
| JP | 2003238196 A | | 8/2003 | |

(Continued)

OTHER PUBLICATIONS

Oliver, W.C. and G. M. Pharr, "Measurement of hardness and elastic modulus by instrumented indentation; Advances in understanding and refinements to methodology", J. Mater. Res., vol. 19 No. 1, Jan. 2004.‡

(Continued)

*Primary Examiner* — Elizabeth A. Bolden

(74) *Attorney, Agent, or Firm* — John P. McGroarty

(57) ABSTRACT

According to one embodiment, a glass may include from about 50 mol. % to about 70 mol. % $SiO_2$; from about 12 mol. % to about 35 mol. % $B_2O_3$; from about 4 mol. % to about 12 mol. % $Al_2O_3$; greater than 0 mol. % and less than or equal to 1 mol. % alkali metal oxide, wherein $Li_2O$ is greater than or equal to about 20% of the alkali metal oxide; from about 0.3 mol. % to about 0.7 mol. % of $Na_2O$ or $Li_2O$; and greater than 0 mol. % and less than 12 mol. % of total divalent oxide, wherein the total divalent oxide includes at least one of CaO, MgO and SrO, and wherein a ratio of $Li_2O$ (mol. %) to ($Li_2O$ (mol. %)+($Na_2O$ (mol. %)) is greater than or equal 0.4 and less than or equal to 0.6. The glass may have a relatively low high temperature resistivity and a relatively high low temperature resistivity.

15 Claims, 8 Drawing Sheets

(56) References Cited

U.S. PATENT DOCUMENTS

2015/0368145 A1    12/2015  Senshu et al.
2015/0376050 A1 ‡  12/2015  Nakamura .............. C03C 3/087 428/41

FOREIGN PATENT DOCUMENTS

| | | | |
|---|---|---|---|
| JP | 2004107112 | ‡ | 4/2004 |
| JP | 2005139031 A | | 6/2005 |
| JP | 2012051773 A | | 3/2012 |
| TW | 459048 B | | 10/2001 |
| TW | 201512144 A | | 4/2015 |
| TW | 201527250 A | | 7/2015 |
| WO | 2010/011701 A2 | | 1/2010 |
| WO | WO-2010011701 | ‡ | 1/2010 |
| WO | WO-2013030848 A1 | ‡ | 3/2013 |
| WO | 2014/122934 A1 | | 8/2014 |
| WO | 2014/122935 A1 | | 8/2014 |
| WO | WO-2014148020 A1 | ‡ | 9/2014 |
| WO | WO-2015179489 A1 | ‡ | 11/2015 |

OTHER PUBLICATIONS

ASTM 0965-96(2012), titled "Standard Practice for Measuring Viscosity of Glass Above the Softening Point.".‡

ASTM C829-81 (2015), titled "Standard Practice for Measurement of L~iquidus Temperature of Glass by the Gradient Furnace Method."‡

ASTM 0598-93(2013), titled "Standard Test for Annealing Point and Strain Point of Glass by Beam Bending."‡

Astm D257.3859 (2016), titled "Standard Test Methods for DC Resistance or Conductance of Insulating Materials."‡

ASTM 0657-93(2013), titled "Standard Test Method for D-C Volume Resistivity of Glass."‡

ASTM E228-11 (2016), "Standard Test Method for Linear Thermal Expansion With a Push-Rod Dilatometer."‡

Kukizaki, M. (2010). Large-scale production of allkali-resistant Shirasu porous glass (SPG) membranes:. Journal of Membrane, Science, 426-435.‡

Rao, K. J. (2002). Structural Chemistry of Glasses. Elsevier, Chapter 12 (See p. 476).‡

Shelby, J. E. (1997). Introduction to Glass Science and Technology. Letchworth: The Royal Society of Chemistry, Chapter 8, pp. 163-187.‡

Varshneya, A. K. (1994). Fundamentals of Inorganic Glasses. San Diego: Acedemic Press.‡

International Search Report and Written Opinion PCT/US2016/067652 dated Apr. 4, 2017.‡

English Translation of CN201680074891.2 Office Action dated Aug. 25, 2020; 7 Pages; Chinese Patent Office.

English Translation of JP2018551897 Office Action dated Oct. 21, 2020; 9 Pages; Japanese Patent Office.

English Translation of TW105142366 Office Action dated Sep. 11, 2020; 3 Pages; Taiwan Patent Office.

European Patent Application No. 16823454.0 Office Action dated Oct. 30, 2020; 5 Pages; European Patent Office.

Taiwanese Patent Application No. 110125344, Notice of Allowance dated Nov. 8, 2021, 3 pages (English Translation Only); Taiwanese Patent Office.

‡ imported from a related application

BOROSILICATE GLASSES WITH LOW ALKALI CONTENT

CROSS-REFERENCE TO RELATED APPLICATIONS

This application is a divisional of U.S. patent application Ser. No. 15/384,687 filed on Dec. 20, 2016, which claims the benefit of priority under 35 U.S.C. § 119 of U.S. Provisional Application Ser. No. 62/270,256 filed on Dec. 21, 2015, the content of each are relied upon and incorporated herein by reference in their entirety.

BACKGROUND

Field

The present specification generally relates to borosilicate glasses and, more specifically, to borosilicate glasses having relatively low alkali content.

Technical Background

Glass substrates are commonly employed in a variety of electronics applications including substrates used in LED and LCD displays, touch screen applications and the like. Chemical strengthening of glass substrates used in such applications can be achieved by an ion exchange process in which smaller alkali metal ions in the glass are exchanged for larger alkali metal ions present in a molten salt bath in which the glass is placed. The amenability of the glass to be strengthened by ion exchange (i.e., its "ion exchangeability") is due, at least in part, to the mobility of alkali ions in the glass. That is, the more mobile the alkali metal ions are in the glass, the more amenable the glass is to strengthening by ion exchange.

While the mobility of alkali metal ions in the glass may facilitate chemical strengthening, high alkali metal ion mobility is not always a desired characteristic in certain applications. For example, some glass substrates may be utilized for display device applications in which a plurality of thin film transistors (TFTs) is deposited on the surface of the glass substrate. When the glass substrate contains highly mobile alkali metal ions, the alkali metal ions may migrate into the TFT material and "poison" the TFTs, rendering them inoperable. Accordingly, for some applications, the amount of alkali metal ions in the glass is reduced or eliminated.

However, eliminating the alkali metal ions from a glass also has negative implications. For example, glasses are typically melted by flowing electric current through the glass. When the highly mobile alkali metal ions are reduced or removed from the glass, the high temperature resistivity of the glass increases significantly along with the voltages necessary to melt the glass which, in turn, causes the refractory materials containing the glass to more rapidly degrade or even fail.

Accordingly, a need exists for alternative glasses which have relatively low high temperature resistivity to aid in melting and relatively high low temperature resistivity to reduce the mobility of alkali metal ions in the glass.

SUMMARY

A first aspect includes a glass comprising from about 50 mol. % to about 70 mol. % $SiO_2$; from about 12 mol. % to about 35 mol. % $B_2O_3$; from about 4 mol. % to about 12 mol. % $Al_2O_3$; greater than 0 mol. % and less than or equal to 1 mol. % alkali metal oxide, wherein $Li_2O$ is greater than or equal to about 20% of the alkali metal oxide; from about 0.3 mol. % to about 0.7 mol. % of $Na_2O$ or $Li_2O$; and greater than 0 mol. % and less than 12 mol. % of total divalent oxide, wherein the total divalent oxide includes at least one of CaO, MgO and SrO, wherein a ratio of $Li_2O$ (mol. %) to ($Li_2O$ (mol. %)+($Na_2O$ (mol. %)) is greater than or equal 0.4 and less than or equal to 0.6.

In a second aspect according to the first aspect, wherein the glass has a low temperature resistivity greater than or equal to $1\times10^9$ Ω-cm.

In a third aspect according to any preceding aspect, wherein the glass has a high temperature resistivity less than or equal to 180 Ω-cm.

In a fourth aspect according to any preceding aspect, wherein the glass has a coefficient of thermal expansion of less than about $40\times10^{-7}$/° C. and a Young's modulus of less than about 65 GPa.

In a fifth aspect according to any preceding aspect, wherein the glass has a liquidus viscosity greater than or equal to 100 kP.

In a sixth aspect according to any preceding aspect, wherein a concentration of $Li_2O$ is greater than or equal to about 40% of the alkali metal oxide.

In a seventh aspect according to any preceding aspect, wherein a Young's modulus of the glass is within +/−0.2 of a maximum Young's modulus of the glass.

In an eighth aspect according to any preceding aspect, wherein a hardness of the glass is within +/−0.2 of a maximum hardness.

In a ninth aspect according to any preceding aspect, wherein the glass comprises less than or equal to 0.5 mol. % alkali metal oxide.

In a tenth aspect according to any preceding aspect, wherein the total divalent oxide is less than or equal to a concentration of $Al_2O_3$+1 mol. %.

In an eleventh aspect according to any preceding aspect, wherein the total divalent oxide is less than or equal to a concentration of $Al_2O_3$.

A twelfth aspect including a glass comprising from about 50 mol. % to about 70 mol. % $SiO_2$; from about 12 mol. % to about 35 mol. % $B_2O_3$; from about 4 mol. % to about 12 mol. % $Al_2O_3$; greater than 0 mol. % and less than or equal to 1 mol. % alkali metal oxide, wherein $Li_2O$ is greater than or equal to about 20% of the alkali metal oxide; from about 0.2 mol. % to about 0.7 mol. % of $K_2O$; and greater than 0 mol. % and less than 12 mol. % of total divalent oxide, wherein the total divalent oxide includes at least one of CaO, MgO and SrO, wherein a ratio of $Li_2O$ (mol. %) to ($Li_2O$ (mol. %)+($Na_2O$ (mol. %)) is greater than or equal 0.4 and less than or equal to 0.6.

In a thirteenth aspect according to the twelfth aspect, wherein the glass has a low temperature resistivity greater than or equal to $1\times10^9$ Ω-cm.

In a fourteenth aspect according to the twelfth or thirteenth aspect, wherein the glass has a high temperature resistivity less than or equal to 180 Ω-cm.

In a fifteenth aspect according to any one of the twelfth through fourteenth aspects, wherein the glass has a coefficient of thermal expansion of less than about $40\times10^{-7}$/° C. and a Young's modulus of less than about 65 GPa.

In a sixteenth aspect according to any one of the twelfth through fifteenth aspects, wherein the glass has a liquidus viscosity greater than or equal to 100 kP.

In a seventeenth aspect according to any one of the twelfth through sixteenth aspects, wherein a concentration of $Li_2O$ is greater than or equal to about 40% of the alkali metal oxide.

In an eighteenth aspect according to any one of the twelfth through seventeenth aspects, wherein a Young's modulus of the glass is within +/−0.2 of a maximum Young's modulus of the glass.

In a nineteenth aspect according to any one of the twelfth through eighteenth aspects, wherein a hardness of the glass is within +/−0.2 of a maximum hardness.

In a twentieth aspect according to any one of the twelfth through nineteenth aspects, wherein the glass comprises less than or equal to 0.5 mol. % alkali metal oxide.

In a twenty-first aspect according to any one of the twelfth through twentieth aspects, wherein the total divalent oxide is less than or equal to a concentration of $Al_2O_3+1$ mol. %.

In twenty-second aspect according to any one of the twelfth through twenty-first aspects, wherein the total divalent oxide is less than or equal to a concentration of $Al_2O_3$.

A twenty-third aspect including a glass laminate comprising a core glass; a clad glass fused to the core glass, the clad glass comprising $SiO_2$, $B_2O_3$, $Al_2O_3$, and greater than 0 mol. % and less than or equal to 1 mol. % alkali metal oxide, wherein: $Li_2O$ is greater than or equal to about 20% of the alkali metal oxide; the clad glass has a first coefficient of thermal expansion; and the core glass has a second coefficient of thermal expansion that is greater than the first coefficient of thermal expansion.

In a twenty-fourth aspect according to the twenty-third aspect, wherein the clad glass has a low temperature resistivity greater than or equal to $1\times10^9$ Ω-cm.

In a twenty-fifth aspect according to the twenty-third or twenty-fourth aspect, wherein the clad glass has a high temperature resistivity less than or equal to 180 Ω-cm.

In a twenty-sixth aspect according to any one of the twenty-third through twenty-fifth aspects, wherein a concentration of $Li_2O$ is greater than or equal to about 40% of the alkali metal oxide.

In a twenty-seventh aspect according to any one of the twenty-third through twenty-sixth aspects, wherein a ratio of $Li_2O$ (mol. %) to ($Li_2O$ (mol. %)+($Na_2O$ (mol. %)) is greater than or equal 0.3 and less than or equal to 0.7.

In a twenty-eighth aspect according to any one of the twenty-third through twenty-seventh aspects, wherein an elastic modulus of the clad glass is within +/−0.2 of a maximum elastic modulus of the clad glass.

In a twenty-ninth aspect to any one of the twenty-third through twenty-eighth aspects, wherein the clad glass is under a compressive stress of at least 40 MPa.

A thirtieth aspect including a consumer electronic product, comprising a housing having a front surface, a back surface and side surfaces; electrical components provide at least partially within the housing; and the glass of any one of the first through twenty-second aspects disposed over the display.

A thirty-first aspect including a consumer electronic product, comprising a housing having a front surface, a back surface and side surfaces; electrical components provide at least partially within the housing; and the glass laminate of any one of the twenty-third through twenty-ninth aspects disposed over the display Additional features and advantages of the glasses described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
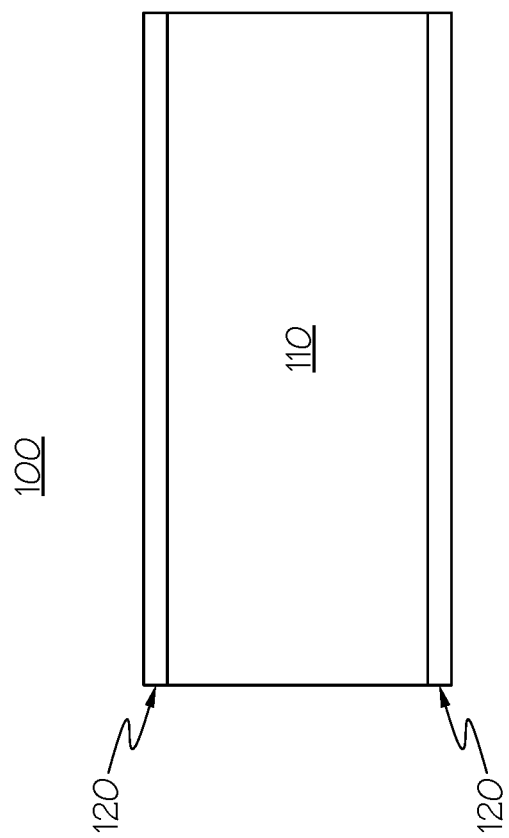
FIG. 1 schematically depicts a glass laminate according to one or more embodiments shown and described herein.

Reference will now be made in detail to embodiments of borosilicate glasses and glass articles comprising the same, examples of which are illustrated in the accompanying drawings. Whenever possible, the same reference numerals will be used throughout the drawings to refer to the same or like parts. According to one embodiment, a glass may include from about 50 mol. % to about 70 mol. % $SiO_2$; from about 12 mol. % to about 35 mol. % $B_2O_3$; from about 4 mol. % to about 12 mol. % $Al_2O_3$; greater than 0 mol. % and less than or equal to 1 mol. % alkali metal oxide, wherein $Li_2O$ is greater than or equal to about 20% of the alkali metal oxide; and greater than 0 mol. % and less than 12 mol. % of total divalent oxide, wherein the total divalent oxide includes at least one of CaO, MgO and SrO. In other embodiments, a glass may include from about 50 mol. % to about 70 mol. % $SiO_2$; from about 12 mol. % to about 35 mol. % $B_2O_3$; from about 4 mol. % to about 12 mol. % $Al_2O_3$; greater than 0 mol. % and less than or equal to 1 mol. % alkali metal oxide, wherein $Li_2O$ is greater than or equal to about 20% of the alkali metal oxide; from about 0.3 mol. % to about 0.7 mol. % of $Na_2O$ or $Li_2O$; and greater than 0 mol. % and less than 12 mol. % of total divalent oxide, wherein the total divalent oxide includes at least one of CaO, MgO and SrO, wherein a ratio of $Li_2O$ (mol. %) to ($Li_2O$ (mol. %)+($Na_2O$ (mol. %)) is greater than or equal 0.4 and less than or equal to 0.6. In still other embodiments, a glass may include from about 50 mol. % to about 70 mol. % $SiO_2$; from about 12 mol. % to about 35 mol. % $B_2O_3$; from about 4 mol. % to about 12 mol. % $Al_2O_3$; greater than 0 mol. % and less than or equal to 1 mol. % alkali metal oxide, wherein $Li_2O$ is greater than or equal to about 20% of the alkali metal oxide; from about 0.2 mol. % to about 0.7 mol. % of $K_2O$; and greater than 0 mol. % and less than 12 mol. % of total divalent oxide, wherein the total divalent oxide includes at least one of CaO, MgO and SrO, wherein a ratio of $Li_2O$ (mol. %) to ($Li_2O$ (mol. %)+($Na_2O$ (mol. %)) is greater than or equal 0.4 and less than or equal to 0.6 Various embodiments of borosilicate glasses and glass articles comprising the same will be described herein with specific reference to the appended drawings.

It should be understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other.

Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

As used herein, the terms "glass", "glasses," "glass article," and "glass articles" are used in their broadest sense to include any object made wholly or partly of glass.

The term "softening point," as used herein, refers to the temperature at which the viscosity of the glass is $1 \times 10^{7.6}$ poise. The softening point was determined using the parallel plate viscosity method of ASTM C1351 M-96(2012).

The term "annealing point," as used herein, refers to the temperature at which the viscosity of the glass is $1 \times 10^{13}$ poise. The annealing point was determined using the beam bending viscosity method of ASTM C598-93(2013).

The terms "strain point" and "$T_{strain}$" as used herein, refer to the temperature at which the viscosity of the glass is $3 \times 10^{14}$ poise. The strain point was determined using the beam bending viscosity method of ASTM C598-93(2013).

Coefficients of thermal expansion (CTE) are expressed in terms of $10^{-7}/°$ C. and represent a value measured over a temperature range from about 20° C. to about 300° C., unless otherwise specified. The linear coefficient of thermal expansion (CTE) over the temperature range 20-300° C. is expressed in terms of ppm/K and was determined using a push-rod dilatometer in accordance with ASTM E228-11.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, a glass that is "substantially free of alkali metal oxides" or "substantially free of $P_2O_5$" is one in which such oxides are not actively added or batched into the glass, but may be present in very small amounts as contaminants.

The glasses described herein are borosilicate glasses which may generally include a combination of $SiO_2$, $B_2O_3$, and $Al_2O_3$. The glasses also include alkali metal oxide including at least $Li_2O$. The glasses may also include at least one alkaline earth oxide. In some embodiments the glasses may further comprise minor amounts of one or more additional oxides such as, for example, $SnO_2$, $As_2O_3$ or the like. These components may be added as, for example, fining agents and/or to further enhance properties of the glasses. The glasses described herein have a relatively high low temperature resistivity, making glass articles formed therefrom amenable for use as substrates on which thin film transistors (TFTs) are deposited. The glasses also have a relatively low high temperature resistivity such that the glasses are readily meltable. Further, the relatively low high temperature resistivity of the glasses aids in reducing or avoiding "fire-through" of refractory vessels and structures used to contain the glass during melting. That is, because the glasses have relatively low high temperature resistivity, lower voltages can be applied across the glass to achieve the desired melting. The use of lower voltages may, in turn, mitigate the dielectric breakdown of the refractory materials.

In the embodiments of the glasses described herein, $SiO_2$ is the largest constituent of the glass and, as such, $SiO_2$ is the primary constituent of the glass network. $SiO_2$ enhances the chemical durability of the glass and, in particular, the resistance of the glass to decomposition in acid and the resistance of the glass to decomposition in water. Accordingly, a high $SiO_2$ concentration is generally desired. However, if the content of $SiO_2$ is too high, the formability of the glass may be diminished as higher concentrations of $SiO_2$ increase the difficulty of melting the glass which, in turn, adversely impacts the formability of the glass. In the embodiments described herein, the glasses generally comprise $SiO_2$ in a concentration greater than or equal to 50 mol. % or even greater than or equal to 55 mol. % and less than or equal to about 70 mol. %. In some embodiments, the concentration of $SiO_2$ in the glass may be greater than about 56 mol. %, greater than about 57 mol. % or even greater than about 58 mol. %. In some other embodiments, the concentration of $SiO_2$ in the glass may be greater than 59 mol. %, greater than 60 mol. % or even greater than 61 mol. %. For example, in some embodiments, the glass may include from about 58 mol. % to about 70 mol. % $SiO_2$. In some other embodiments, the glass may include from about from about 60 mol. % to about 70 mol. % $SiO_2$. In still other embodiments, the glass may include from about 65 mol. % $SiO_2$ to about 70 mol. % $SiO_2$.

In addition to $SiO_2$, the glasses described herein comprise the glass network formers $Al_2O_3$ and $B_2O_3$. $Al_2O_3$ and $B_2O_3$ may be added to assist with stable glass formation and to facilitate melting and forming. By mixing these network formers in appropriate concentrations, it is possible to achieve stable bulk glass formation while minimizing the need for network modifiers, such as alkali or alkaline earth oxides, which act to increase the CTE and modulus of the glass.

Like $SiO_2$, $Al_2O_3$ contributes to the rigidity of the glass network and increases the viscosity of the glass due to its primarily tetrahedral coordination in a glass melt. Further, an increase in the concentration of $Al_2O_3$ relative to alkali oxides or alkaline earth oxides in the glass generally decreases the CTE of the glass and increases the durability of the glass. When the concentration of $Al_2O_3$ in the glass is high (e.g., greater than about 12 mol. %), the glass may be difficult to melt. When the concentration of $Al_2O_3$ in the glass is low (e.g., less than about 5 mol. %) modifiers in the glass convert $B_2O_3$ from three-fold coordination to four-fold coordination which, in turn, decreases the damage resistance of the glass.

In the embodiments of the glass described herein, the concentration of $Al_2O_3$ in the glass is generally less than or equal to about 12 mol. %. For example, in some embodiments, the concentration of $Al_2O_3$ in the glass is greater than or equal to about 4 mol. % and less than or equal to about 12 mol. %. In some embodiments, the concentration of $Al_2O_3$ in the glass may be greater than or equal to about 5 mol. % and less than or equal to about 10 mol. %. In some other embodiments, the concentration of $Al_2O_3$ may be greater than or equal to about 6 mol. % and less than or equal to about 8 mol. %.

Like $SiO_2$ and $Al_2O_3$, $B_2O_3$ contributes to the formation of the glass network. $B_2O_3$ is added to the glass to decrease the viscosity and liquidus temperature of the glass. Specifically, an increase in the concentration of $B_2O_3$ by 1 mol. % may decrease the temperature required to obtain an equivalent viscosity by 10° C. to 14° C., depending on the specific composition of the glass. However, $B_2O_3$ can lower the liquidus temperature of the glass by 18° C. to 22° C. per mol. % of $B_2O_3$. As such, $B_2O_3$ decreases the liquidus temperature of the glass more rapidly than it decreases the liquidus viscosity of the glass, effectively increasing the liquidus viscosity. $B_2O_3$ can be added to the glass to soften the glass network with only minimal impact on the CTE. Accordingly, $B_2O_3$ is useful for improving the melting performance without increasing the low temperature CTE (i.e., the CTE from 20° C. to 300° C.). Additions of $B_2O_3$ to the glass also reduce the Young's modulus of the glass and improve the damage resistance of the glass. Additions of $B_2O_3$ also decrease the diffusivity of ions in the glass network (such as alkali metal ions).

When the concentration of $B_2O_3$ in the glass is low (e.g., less than about 12 mol. %), the damage resistance of the glass is diminished. However, when the concentration of $B_2O_3$ in the glass is high (e.g., greater than about 35 mol. %), the glass becomes too soft and the formability of the glass is diminished. In addition, significant and undesired phase separation may occur within the glass.

Accordingly, in the embodiments described herein, $B_2O_3$ is generally present in the glass in a concentration less than or equal to about 35 mol. %. For example, in some embodiments, $B_2O_3$ is present in the glass in a concentration greater than or equal to about 12 mol. % and less than or equal to about 35 mol. %. In some embodiments, the concentration of $B_2O_3$ in the glass may be greater than or equal to about 15 mol. % and less than or equal to about 30 mol. % or even less than or equal to about 30 mol. %. In some other embodiments, the concentration of $B_2O_3$ in the glass may be greater than or equal to about 15 mol. % and less than or equal to about 25 mol. % or even less than or equal to about 20 mol. %.

In the embodiments described herein, the glasses contain a relatively low concentration of alkali metal oxide $R_2O$, where R is an alkali metal such as Na, K, and Li. Specifically, in the embodiments described herein, the total alkali metal oxide concentration in the glasses (i.e., the sum of the concentration of all the alkali metal oxides in the glasses) is greater than 0 mol. % and less than or equal to 1 mol. %. In some embodiments, the total alkali metal oxide concentration in the glass may be greater than 0 mol. % and less than or equal to 0.9 mol. % or even less than or equal to 0.8 mol. %. In some other embodiments, the total alkali metal oxide concentration in the glass may be greater than 0 mol. % and less than or equal to 0.7 mol. % or even less than or equal to 0.6 mol. %. In still other embodiments, the total alkali metal oxide concentration in the glass may be greater than 0 mol. % and less than or equal to 0.5 mol. % or even less than or equal to 0.4 mol. %. In other embodiments, the total alkali metal oxide concentration in the glass may be greater than 0 mol. % and less than or equal to 0.3 mol. % or even less than or equal to 0.2 mol. %.

In general, smaller alkali metal ions are more mobile in the glass network and, as a result, it is expected that increasing the concentration of smaller alkali metal ions relative to larger alkali metal ions decreases the resistivity of the glass. For example, it is expected that decreasing the concentration of $Na_2O$ in the glass and increasing the concentration of $Li_2O$ in the glass would lower the resistivity of the resultant glass due to the increased concentration of highly mobile lithium ions in the glass.

Indeed, additions of $Li_2O$ have been found to decrease the resistivity of the glass at elevated temperatures (e.g., at melting temperatures) due to the increased mobility of the lithium ions in the glass. This enables the glass to be melted at lower applied voltages which, in turn, extends the service life of the refractory vessels which contain the glass during melting, thereby reducing manufacturing costs.

However, it has been unexpectedly found that increasing the concentration of $Li_2O$ in the glasses described herein actually increases the resistivity of the glasses at relatively lower temperatures (i.e., temperatures in the range of 250° C. to 500° C. which are low compared to the melting temperature of the glass). The increase in resistivity is generally indicative of a decrease in the mobility of alkali metal ions in the glass network in the indicated temperature range. When the glass is used to form a substrate upon which TFTs are deposited, the reduced mobility of the alkali metal ions may, for example, mitigate the migration of alkali metal ions from the glass to the TFTs at substrate processing temperatures (i.e., the temperatures at which the substrates having the TFTs are processed either during TFT deposition or thereafter, typically in the range of 250° C. to 500° C.). Thus, the glasses described herein have relatively low resistivity at higher temperatures and unexpectedly high resistivity at lower temperatures which enables the glass to be readily melted and formed while mitigating the migration of alkali metal ions at, for example, typical processing temperatures for glass substrates having TFTs deposited thereon.

Accordingly, in the embodiments described herein, the alkali metal oxide in the glasses includes $Li_2O$ in a concentration sufficient to increase the resistivity at relatively low temperatures. In embodiments, $Li_2O$ is present in the glass in a concentration that is greater than or equal to 20% of the total alkali metal oxide concentration in the glass. For example, if the total alkali metal oxide concentration in the glass is 1.0 mol. %, at least 0.2 mol. % of the total alkali metal oxide concentration consists of $Li_2O$. In embodiments, $Li_2O$ may be present in the glass in a concentration that is greater than or equal to 20% or even 30% of the total alkali metal oxide concentration in the glass. In still other embodiments, $Li_2O$ may be present in the glass in a concentration that is greater than or equal to 40% or even 50% of the total alkali metal oxide concentration in the glass. In yet other embodiments, $Li_2O$ may be present in the glass in an amount that is greater than or equal to 60% of the total alkali metal oxide concentration in the glass. In some embodiments, $Li_2O$ may be present in the glass in a concentration that is greater than or equal to 20% and less than or equal to 100% of the total alkali metal oxide concentration. In some other embodiments, $Li_2O$ may be present in the glass in a concentration that is greater than or equal to 35% and less than or equal to 65% of the total alkali metal oxide concentration. In still other embodiments, $Li_2O$ may be present in the glass in a concentration that is greater than or equal to 40% and less than or equal to 50% of the total alkali metal oxide concentration.

When the concentration of $Li_2O$ in the glass is low (e.g., less than about 0.04 mol. %), the meltability of the glass is diminished. However, when the concentration of $Li_2O$ in the glass is high (e.g., greater than about 1 mol. %), the resistivity of the glass is low at temperatures from about 250° C. to about 500° C., making the glass undesirable for some applications. Accordingly, in the embodiments described herein, $Li_2O$ is present in the glass in concentration greater than or equal to 0.04 mol. % and less than or equal to 1.0 mol. %. For example, $Li_2O$ may be present in the glass in concentration greater than or equal to 0.1 mol. % or even greater than or equal to 0.2 mol. % and less than or equal to 1.0 mol. %. In embodiments, the concentration of $Li_2O$ in the glass may be greater than or equal to 0.3 mol. % or even greater than or equal to 0.4 mol. % and less than or equal to 1.0 mol. %. In embodiments, the concentration of $Li_2O$ in the glass may be greater than or equal to 0.5 mol. % or even greater than or equal to 0.6 mol. % and less than or equal to 1.0 mol. %. In embodiments, the concentration of $Li_2O$ in the glass may be greater than or equal to 0.7 mol. % or even 0.8 mol. % and less than or equal to 1.0 mol. %. In embodiments, the concentration of $Li_2O$ in the glass may be greater than or equal to 0.9 mol. % and less than or equal to 1.0 mol. %. In some embodiments, the glass may contain 1 mol. % $Li_2O$ (that is, 100% of the total alkali metal oxide is $Li_2O$).

In some other embodiments, the concentration of $Li_2O$ in the glass may be greater than or equal to 0.1 mol. % and less than or equal to 0.9 mol. %. For example, in some embodiments, the concentration of $Li_2O$ in the glass may be greater than or equal to 0.2 mol. % and less than or equal to 0.8 mol. %. In some embodiments, the concentration of $Li_2O$ in the glass may be greater than or equal to 0.3 mol. % and less than or equal to 0.7 mol. %. In still other embodiments, the concentration of $Li_2O$ in the glass may be greater than or equal to 0.4 mol. % and less than or equal to 0.6 mol. %. In embodiments, the concentration of $Li_2O$ in the glass may be greater than or equal to 0.4 mol. % less than or equal to 0.5 mol. %. In embodiments, the concentration of $Li_2O$ in the glass may be greater than 0 mol. % less than or equal to 0.3 mol. %. In still other embodiments, the concentration of $Li_2O$ in the glass may be greater than 0 mol. % less than or equal to 0.2 mol. %.

In embodiments, the alkali metal oxide may optionally include $K_2O$ in addition to $Li_2O$. When the concentration of $K_2O$ in the glass is high (e.g., greater than about 0.8 mol. %), the resistivity of the glass at temperatures from about 250° C. to about 500° C. is low, making the glass undesirable for some applications. In embodiments where $K_2O$ is included, the concentration of $K_2O$ in the glass is greater than or equal to about 0 mol. % and less than or equal to about 0.8 mol. %. In some of these embodiments the concentration of $K_2O$ in the glass may be greater than or equal to 0.2 mol. % and less than or equal to 0.7 mol. % or even less than or equal to 0.6 mol. %. In still other embodiments, the concentration of $K_2O$ in the glass may be greater than or equal to 0.2 mol. % and less than or equal to 0.5 mol. % or even less than or equal to 0.4 mol. %. In other embodiments, the concentration of $K_2O$ in the glass may be greater than or equal to 0.2 mol. % and less than or equal to 0.3 mol. %. In embodiments, the glass may be substantially free of $K_2O$.

In embodiments, the alkali metal oxide may optionally include $Na_2O$ in addition to $Li_2O$. When the concentration of $Na_2O$ in the glass is high (e.g., greater than about 0.8 mol. %), the resistivity of the glass at temperatures from about 250° C. to about 500° C. is low, making the glass undesirable for some applications. Accordingly, in embodiments of the glasses described herein, the concentration of $Na_2O$ in the glass is greater than or equal to about 0 mol. % and less than or equal to about 0.8 mol. %. In some embodiments the concentration of $Na_2O$ in the glass may be greater than or equal to 0.2 mol. % and less than or equal to 0.7 mol. % or even less than or equal to 0.6 mol. %. In still other embodiments, the concentration of $Na_2O$ in the glass may be greater than or equal to 0.2 mol. % and less than or equal to 0.5 mol. % or even less than or equal to 0.4 mol. %. In yet other embodiments, the concentration of $Na_2O$ in the glass may be greater than or equal to 0.2 mol. % and less than or equal to 0.3 mol. %. In embodiments, the glass may be substantially free of $Na_2O$.

In the embodiments described herein, the ratio of $Li_2O$ (mol. %) in the glass to the sum of $Li_2O$ (mol. %) and $Na_2O$ (mol. %) is greater than or equal to 0.2 and less than or equal to 1.0. For example, in embodiments the ratio of $Li_2O$ (mol. %) to the sum of $Li_2O$ (mol. %) and $Na_2O$ (mol. %) may be greater than or equal to 0.3 or even greater than or equal to 0.4 and less than or equal to 1.0. In some embodiments the ratio of $Li_2O$ (mol. %) to the sum of $Li_2O$ (mol. %) and $Na_2O$ (mol. %) may be greater than or equal to 0.5 or even greater than or equal to 0.6 and less than or equal to 1.0. In some other embodiments the ratio of $Li_2O$ (mol. %) to the sum of $Li_2O$ (mol. %) and $Na_2O$ (mol. %) may be greater than or equal to 0.7 or even greater than or equal to 0.8 and less than or equal to 1.0. In still other embodiments the ratio of $Li_2O$ (mol. %) to the sum of $Li_2O$ (mol. %) and $Na_2O$ (mol. %) may be greater than or equal to 0.9 and less than or equal to 1.0. In some other embodiments the ratio of $Li_2O$ (mol. %) to the sum of $Li_2O$ (mol. %) and $Na_2O$ (mol. %) may be greater than or equal to 0.3 and less than or equal to 0.7. In still other embodiments, the ratio of $Li_2O$ (mol. %) to the sum of $Li_2O$ (mol. %) and $Na_2O$ (mol. %) may be greater than or equal to 0.4 and less than or equal to 0.6.

The glasses described herein may further include divalent oxide MO, where M is an alkaline earth metal (such as Mg, Ca, and Sr) and/or Zn. The divalent oxide improves the melting behavior of the glass but increases the average coefficient of thermal expansion. When the divalent oxide includes alkaline earth metal oxides, the alkaline earth metal oxides do not increase the average coefficient of thermal expansion of the glass as much as the alkali metal oxide(s) contained in the glass.

In the embodiments described herein, the total divalent oxide concentration (i.e., the sum of all the divalent oxides) in the glass is greater than or equal to 0 mol. % and less than or equal to about 12 mol. %. In some embodiments, the total divalent oxide concentration in the glass may be greater than or equal to 1 mol. % and less than or equal to about 10 mol. %. In some other embodiments, the total divalent oxide concentration in the glass may be greater than or equal to 3 mol. % and less than or equal to about 8 mol. %.

In the embodiments described herein, the total divalent oxide includes at least one of CaO, MgO, and SrO.

In embodiments, MgO may be present in the glass in a concentration greater than or equal to about 0 mol. % and less than or equal to about 5 mol. % or even a concentration greater than or equal to about 0.5 mol. % and less than or equal to about 4 mol. %. In some other embodiments, MgO may be present in the glass in a concentration greater than or equal to about 0.5 mol. % and less than or equal to about 3.5 mol. % or even a concentration greater than or equal to about 0.5 mol. % and less than or equal to about 3 mol. %. In still other embodiments, MgO may be present in the glass in a concentration greater than or equal to about 0.5 mol. % and less than or equal to about 2.5 mol. % or even a concentration greater than or equal to about 0.5 mol. % and less than or equal to about 2 mol. %. In yet other embodiments, MgO may be present in the glass in a concentration greater than or equal to about 0.5 mol. % and less than or equal to about 1.5 mol. % or even a concentration greater than or equal to about 0.5 mol. % and less than or equal to about 1 mol. %.

CaO may be present in the glass in a concentration greater than or equal to about 0 mol. % and less than or equal to about 12 mol. % or even a concentration greater than or equal to about 1 mol. % and less than or equal to about 10 mol. %. In some embodiments, CaO may be present in the glass in a concentration greater than or equal to about 1.5 mol. % and less than or equal to about 9 mol. % or even a concentration greater than or equal to about 2.0 mol. % and less than or equal to about 8 mol. %. In still other embodiments, CaO may be present in the glass in a concentration greater than or equal to about 2.0 mol. % and less than or equal to about 7 mol. % or even a concentration greater than or equal to about 2.0 mol. % and less than or equal to about 6.5 mol. %. In yet other embodiments, CaO may be present in the glass in a concentration greater than or equal to about 2.0 mol. % and less than or equal to about 6.0 mol. % or even a concentration greater than or equal to about 2.5 mol. % and less than or equal to about 6 mol. %.

SrO may be present in the glass in a concentration greater than or equal to about 0 mol. % and less than or equal to about 3 mol. % or even a concentration greater than or equal to about 0.5 mol. % and less than or equal to about 2.5 mol. %. In some other embodiments, SrO may be present in the glass in a concentration greater than or equal to about 0.5 mol. % and less than or equal to about 2.0 mol. % or even a concentration greater than or equal to about 0.5 mol. % and less than or equal to about 1.5 mol. %. In still other embodiments, SrO may be present in the glass in a concentration greater than or equal to about 0.5 mol. % and less than or equal to about 1.0 mol. %.

In embodiments, ZnO may be present in the glass in a concentration greater than or equal to about 0 mol. % and less than or equal to about 5 mol. % or even a concentration greater than or equal to about 0.5 mol. % and less than or equal to about 4 mol. %. In some other embodiments, ZnO may be present in the glass in a concentration greater than or equal to about 0.5 mol. % and less than or equal to about 3.5 mol. % or even a concentration greater than or equal to about 0.5 mol. % and less than or equal to about 3 mol. %. In still other embodiments, ZnO may be present in the glass in a concentration greater than or equal to about 0.5 mol. % and less than or equal to about 2.5 mol. % or even a concentration greater than or equal to about 0.5 mol. % and less than or equal to about 2 mol. %. In yet other embodiments, ZnO may be present in the glass in a concentration greater than or equal to about 0.5 mol. % and less than or equal to about 1.5 mol. % or even a concentration greater than or equal to about 0.5 mol. % and less than or equal to about 1 mol. %.

In embodiments, the glasses described herein may have a relatively high resistance to damage. This may be achieved by maintaining the majority of $B_2O_3$ in the glass in a three-fold coordinated state by ensuring that the total divalent oxide concentration in the glass (i.e., the sum of the concentration of ZnO, MgO, CaO, and SrO) is less than or equal to the concentration of $Al_2O_3$+1 mol. %. In some embodiments, the total divalent oxide concentration in the glass (i.e., the sum of the concentration of ZnO, MgO, CaO, and SrO) may be greater than or equal to 4.0 mol. % and less than or equal to the concentration of $Al_2O_3$+1 mol. %. In some other embodiments, the majority of $B_2O_3$ in the glass may be maintained in a three-fold coordinated state by ensuring that the total divalent oxide concentration in the glass (i.e., the sum of the concentration of ZnO, MgO, CaO, and SrO) is less than or equal to the concentration of $Al_2O_3$. In still other embodiments, the total divalent oxide concentration in the glass (i.e., the sum of the concentration of ZnO, MgO, CaO, and SrO) may be greater than or equal to 4.0 mol. % and less than or equal to the concentration of $Al_2O_3$.

In some embodiments, the sum of the total alkali metal oxide concentration and the total divalent oxide concentration in the glasses described herein is greater than or equal to 4 mol. %. In some other embodiments, the sum of the total alkali metal oxide concentration and the total divalent oxide concentration may be greater than or equal to 4 mol. % and less than or equal to the concentration of $Al_2O_3$.

The glasses described herein may optionally include one or more fining agents. The fining agents may include, for example, $SnO_2$, $As_2O_3$, $Sb_2O_3$ and combinations thereof. The fining agents may be present in the glasses in an amount greater than or equal to about 0 mol. % and less than or equal to about 0.7 mol. %. In exemplary embodiments, the fining agent is $SnO_2$. The $SnO_2$ may be present in the glass in a concentration greater than or equal to about 0 mol. % and less than or equal to about 0.7 mol. %. In these embodiments, $SnO_2$ may be present in the glass in a concentration which is greater than about 0 mol. % and less than or equal to about 0.7 mol. % or even less than or equal to about 0.15 mol. %.

A small amount of $ZrO_2$ may also be introduced into the glass by contact between molten glass and zirconia-based refractory materials in the melter. Monitoring the level of $ZrO_2$ in the glass may provide a basis for estimating the rate of refractory wear over time. In the embodiments described herein, the glass may include greater than or equal to 0 mol % and less than or equal to 0.2 mol % $ZrO_2$.

The glass may further comprise low concentrations of $Fe_2O_3$, as $Fe_2O_3$ is a common impurity in batch materials. In some embodiments, the glass may include up to about 0.5 mol % $Fe_2O_3$ and, in other embodiments, up to about 0.2 mol % $Fe_2O_3$.

In some embodiments, the glasses described herein may be free of $P_2O_5$.

As noted hereinabove, the additions of $Li_2O$ to the glass result in a relatively low high temperature resistivity and a relatively high low temperature resistivity. In the embodiments described herein, the high temperature resistivity of the glasses is the resistivity (in ohm-cm ($\Omega$-cm)) at a temperature of 1630° C. In embodiments, the low temperature resistivity is the resistivity (in $\Omega$-cm) of a glass article (such as a glass substrate or the like) at a temperature of 250° C. The resistivity (high temperature or low temperature) was determined using ASTM D257-14 and ASTM C657-93 (2013).

In the embodiments described herein, the glass has a high temperature resistivity of less than or equal to 180 $\Omega$-cm. In some embodiments, the high temperature resistivity may be less than or equal to 170 $\Omega$-cm or even less than or equal to 160 Ω-cm. In some other embodiments, the high temperature resistivity may be less than or equal to 150 Ω-cm or even less than or equal to 140 Ω-cm. In still other embodiments, the high temperature resistivity may be less than or equal to 130 Ω-cm or even less than or equal to 120 Ω-cm. In some other embodiments, the high temperature resistivity may be less than or equal to 110 Ω-cm. In some embodiments, the high temperature resistivity may be less than or equal to 100 Ω-cm or even less than or equal to 90 Ω-cm. In some other embodiments, the high temperature resistivity may be less than or equal to 80 Ω-cm or even less than or equal to 70 Ω-cm. In still other embodiments, the high temperature resistivity may be less than or equal to 60 Ω-cm or even less than or equal to 50 Ω-cm. In each of these embodiments, the high temperature resistivity is greater than or equal to 40 Ω-cm.

In the embodiments described herein, the glass has a low temperature resistivity of greater than or equal to $1 \times 10^9$ Ω-cm. In some embodiments, the low temperature resistivity may be greater than or equal to $2.5 \times 10^9$ Ω-cm or even greater than or equal to $5.0 \times 10^9$ Ω-cm. In some embodiments, the low temperature resistivity may be greater than or equal to $10.0 \times 10^9$ Ω-cm or even greater than or equal to $15 \times 10^9$ Ω-cm. In some other embodiments, the low temperature resistivity may be greater than or equal to $20 \times 10^9$ Ω-cm or even greater than or equal to $25 \times 10^9$ Ω-cm. In still other embodiments, the low temperature resistivity may be greater than or equal to $30 \times 10^9$ Ω-cm or even greater than or equal to $35 \times 10^9$ Ω-cm. In other embodiments, the low temperature resistivity may be greater than or equal to $40 \times 10^9$ Ω-cm or even greater than or equal to $45 \times 10^9$ Ω-cm. In still other embodiments, the low temperature resistivity may be greater than or equal to $50 \times 10^9$ Ω-cm or even greater than or equal to $55 \times 10^9$ Ω-cm. In yet other embodiments, the low temperature resistivity may be greater than or equal to $60 \times 10^9$ Ω-cm or even greater than or equal to $65 \times 10^9$ Ω-cm. In each of these embodiments, the low temperature resistivity is less than or equal to $80 \times 10^9$ Ω-cm.

In some embodiments, the glasses described herein are formable by down-draw processes, such as slot-draw and fusion-draw processes. The fusion draw process is commonly used for the large-scale manufacture of thin glass sheets. Compared to other flat glass manufacturing techniques, such as the float or slot draw processes, the fusion draw process yields thin glass sheets with superior flatness and surface quality. As a result, the fusion draw process has become the dominant manufacturing technique in the fabrication of thin glass substrates for liquid crystal displays, as well as for cover glasses for personal electronic devices such as notebooks, entertainment devices, tablets, laptops, and the like.

The fusion draw process is generally described in, for example, U.S. Pat. No. 3,149,949, the entirety of which is incorporated by reference herein. The fusion draw process involves the flow of molten glass over a trough known as an "isopipe," which is typically made of zircon or another refractory material. The molten glass overflows the top of the isopipe from both sides, meeting at the bottom of the isopipe to form a single sheet where only the interior of the final sheet has made direct contact with the isopipe. Since neither exposed surface of the final glass sheet has makes contact with the isopipe material during the draw process, both outer surfaces of the glass are of pristine quality and do not require subsequent finishing.

In order to be fusion drawable, a glass must have a sufficiently high liquidus viscosity (i.e., the viscosity of a molten glass at the liquidus temperature). In some embodiments, the glasses described herein have a liquidus viscosity of at least about 100 kilopoise (kpoise), in other embodiments, at least about 120 kpoise, and in still other embodiments, these glasses have a liquidus viscosity of at least about 300 kpoise. In those instances in which the glasses described herein are used as a clad layer in a glass laminate and the viscosity behavior of the core glass with respect to temperature is approximately the same as that of the clad glass, the liquidus viscosity of the clad glass may be greater than or equal to about 70 kPoise. The liquidus viscosity is determined by the following method. First the liquidus temperature of the glass is measured in accordance with ASTM C829-81 (2015), titled "Standard Practice for Measurement of Liquidus Temperature of Glass by the Gradient Furnace Method". Next the viscosity of the glass at the liquidus temperature is measured in accordance with ASTM C965-96(2012), titled "Standard Practice for Measuring Viscosity of Glass Above the Softening Point".

Traditional fusion draw is accomplished using a single isopipe, resulting in a homogeneous glass product. The more complicated fusion lamination process is generally described in U.S. Pat. No. 4,214,886, which is incorporated herein by reference. The fusion lamination process makes use of two isopipes to form a laminated glass sheet comprising a core glass composition surrounded on either (or both) side by outer clad layers. One of the main advantages of fusion lamination is that when the coefficient of thermal expansion of the clad glass is less than that of the core glass, the CTE difference results in a compressive stress in the outer clad layer(s). This compressive stress increases the strength of the final glass product without the need for ion exchange treatment. Unlike ion exchange, this strengthening can be achieved without the use of alkali ions in the glass.

Accordingly, in some embodiments, the glasses described herein may be used to form a glass laminate, as schematically depicted in FIG. 1. Glass laminate 100 comprises a core glass 110 fused to a clad glass 120 or "clad layer" formed from the glasses described herein. The core glass 110 has a CTE that is greater than that of the clad glass 120. The core glass may, in some embodiments, be an alkali aluminosilicate glass, for example. In one non-limiting example, the core glass is an alkali aluminosilicate glass having the composition 66.9 mol % $SiO_2$, 10.1 mol % $Al_2O_3$, 0.58 mol % $B_2O_3$, 7.45 mol % $Na_2O$, 8.39 mol % $K_2O$, 5.78 mol % MgO, 0.58 mol % CaO, 0.2 mol % $SnO_2$, 0.01 mol % $ZrO_2$, and 0.01 mol % $Fe_2O_3$, with a strain point of 572° C., an anneal point of 629° C., a softening point of 888° C., and a CTE=$95.5 \times 10^{-7}$/° C.

When employed as a clad glass in a glass laminate, the glasses described herein can provide high compressive stresses to the clad layer. The CTE of the glasses described herein is generally in the range of about $40 \times 10^{-7}$/° C. or less and, in some embodiments, in the range of about $35 \times 10^{-7}$/° C. or less. When such a glass is paired with, for example, an alkali aluminosilicate glass (e.g., Gorilla® Glass, manufactured by Corning Incorporated) having a CTE of $90 \times 10^{-7}$/° C., the expected compressive stress in the clad glass can be calculated using the elastic stress equations given below in which subscripts 1 and 2 refer to the core glass and the clad glass, respectively:

$$\sigma_2 = \frac{E_1(e_2 - e_1)}{\left(\frac{E_1}{E_2}(1-v_2)\right) + \left(\frac{2t_2}{t_1}(1-v_1)\right)}$$

-continued and $$\sigma_1 = -\frac{2t_2}{t_1}\sigma_2$$

where E is Young's modulus, ν is Poisson's ratio, t is the glass thickness, σ is the stress, and $e_2-e_1$ is the difference in thermal expansion between the clad glass and the core glass. Using the same elastic modulus and Poisson's ratio for the clad glass and core glass further simplifies the above equations.

To calculate the difference in thermal expansion between the clad glass and core glass, it is assumed that the stress sets in below the strain point of the softer glass of the clad and core. The stresses in the clad glass can be estimated using these assumptions and the equations above. For typical display-like glass with a CTE of $30\times10^{-7}/°$ C. as the clad glass and an alkali aluminosilicate core glass with CTE of $90\times10^{-7}/°$ C., overall thicknesses in the range of 0.5-1.0 mm and clad glass thickness of 10-100 μm, the compressive stress of the clad glass is estimated to be in a range from about 200 MPa to about 315 MPa. In some embodiments, the glasses described herein have coefficients of thermal expansion of less than about $40\times10^{-7}/°$ C. and, in some embodiments, less than about $35\times10^{-7}/°$ C. For these glasses, the compressive stress of the clad glass layer would be at least about 40 MPa, and in other embodiments, at least about 80 MPa.

The glasses described herein have particularly low coefficients of thermal expansion. In some embodiments, the CTE of the glass is less than less than about $40\times10^{-7}/°$ C. and, in other embodiments, is less than about $35\times10^{-7}/°$ C. When paired with a core glass having a higher CTE, the glasses described herein provide a high level of compressive stress in the clad layers of the final laminated glass product. This increases the strength of the glass laminate product. Room-temperature compressive stresses of at least about 40 MPa and, in some embodiments, at least about 80 MPa are attainable by using the glasses disclosed herein in the clad layer of the laminate. When used as a clad layer, the liquidus viscosity requirements of the glasses described herein may be lowered. In those embodiments where the viscosity behavior of the core glass with respect to temperature is approximately the same as (i.e., "matched with") that of the clad glass, the liquidus viscosity of the clad glass may be greater than or equal to about 70 kPoise.

The glasses described herein have values of Young's modulus (i.e., the elastic modulus) and shear modulus that are significantly less than those of other commercially available fusion-drawn glasses. In some embodiments, the Young's modulus is less than about 65 gigapascals (GPa) and, in still other embodiments, less than about 60 GPa. The low elastic moduli provide these glasses with a high level of damage resistance.

In the embodiments described herein, it has been determined that the value of the Young's modulus of the glasses can be controlled (and therefore tailored to a specific value) by adjusting the relative concentration of $Li_2O$ and $Na_2O$ in the glass. In embodiments, when the ratio of $Li_2O$ (mol. %) to the sum of $Li_2O$ (mol. %) and $Na_2O$ (mol. %) is greater than or equal to 0.3 and less than or equal to 0.7, the Young's modulus of the glass is within +/−0.2 of the maximum Young's modulus of the glass. In some other embodiments, when the ratio of $Li_2O$ (mol. %) to the sum of $Li_2O$ (mol. %) and $Na_2O$ (mol. %) is greater than or equal to 0.4 and less than or equal to 0.6, the Young's modulus of the glass is within +/−0.1 of the maximum Young's modulus of the glass.

Glass articles formed from the glasses described herein generally have a hardness of greater than or equal to about 5 GPa, such as greater than or equal to about 5.5 GPa, greater than or equal to about 6 GPa, or even greater than or equal to about 6.5 GPa. In these embodiments, the hardness is usually less than or equal to about 8 GPa or even 7 GPa.

In the embodiments described herein, the hardness and Young's modulus of the glass are determined by nanoindentation which includes indenting the surface of the glass with a Berkovitch indenter to form an indent having an indentation depth in the range from about 50 nm to about 1000 nm and determining the hardness and the Young's modulus based on the measured response of the indentation instrument using the procedure of Oliver, W. C. and G. M. Pharr, "Measurement of hardness and elastic modulus by instrumented indentation: Advances in understanding and refinements to methodology", J. Mater. Res., Vol 19 No. 1, January 2004.

As with the Young's modulus, it has been determined that the hardness of the glasses can be controlled (and therefore tailored to a specific value) by adjusting the relative concentration of $Li_2O$ and $Na_2O$ in the glass. In embodiments, when the ratio of $Li_2O$ (mol. %) to the sum of $Li_2O$ (mol. %) and $Na_2O$ (mol. %) is greater than or equal to 0.3 and less than or equal to 0.7, the hardness of the glass is within +/−0.2 of the maximum hardness of the glass. In some other embodiments, when the ratio of $Li_2O$ (mol. %) to the sum of $Li_2O$ (mol. %) and $Na_2O$ (mol. %) is greater than or equal to 0.4 and less than or equal to 0.6, the hardness of the glass is within +/−0.1 of the maximum hardness of the glass.

EXAMPLES

The embodiments described herein will be further clarified by the following examples.

Example 1

To assess the high temperature resistivity of glasses containing different alkali species, $Na_2O$ in a base-glass composition was incrementally replaced with either $K_2O$ or $Li_2O$ and the resistivity of the resultant glass was measured as a function of the ratio of $M^+:(Na^++M^+)$, where M is $Li^+$ or K. Specifically, the base glass composition consisted of 67.04 mol % $SiO_2$, 19.79 mol. % $B_2O_3$, 6.25 mol. % $Al_2O_3$, 0.57 mol. % MgO, 4.85 mol. % CaO, 0.45 mol. % SrO, 0.88 mol. % $Na_2O$, 0.01 mol. % $K_2O$, 0.08 mol. % $SnO_2$, and 0.03 mol. % $ZrO_2$. In a first trial, the $Na_2O$ in the base glass composition was incrementally replaced with $K_2O$ and the resistivity was measured at 1630° C. for different values of the ratio of $K^+:(Na^++K^+)$. The end glass composition of this first trial consisted of 66.64 mol % $SiO_2$, 19.82 mol. % $B_2O_3$, 6.20 mol. % $Al_2O_3$, 0.56 mol. % MgO, 4.83 mol. % CaO, 0.44 mol. % SrO, 0.45 mol. % $Na_2O$, 0.42 mol. % $K_2O$, 0.08 mol. % $SnO_2$, and 0.04 mol. % $ZrO_2$. In a second trial, the $Na_2O$ in the base glass composition was incrementally replaced with $Li_2O$ and the resistivity was measured at 1630° C. for different values of the ratio of $Li^+:(Na^++Li^+)$. The end glass composition of this second trial consisted of 67.26 mol % $SiO_2$, 20.00 mol. % $B_2O_3$, 6.28 mol. % $Al_2O_3$, 0.61 mol. % MgO, 4.85 mol. % CaO, 0.45 mol. % SrO, 0.03 mol. % $Na_2O$, 0 mol. % $K_2O$, 0.76 mol. % $Li_2O$, 0.14 mol. % $SnO_2$, and 0.07 mol. % $ZrO_2$. The high temperature resistivity of the glass for these two trials are graphically depicted in FIG. 2 as a function of the ratio of $M^+:(Na^++M^+)$.

Figure 2:
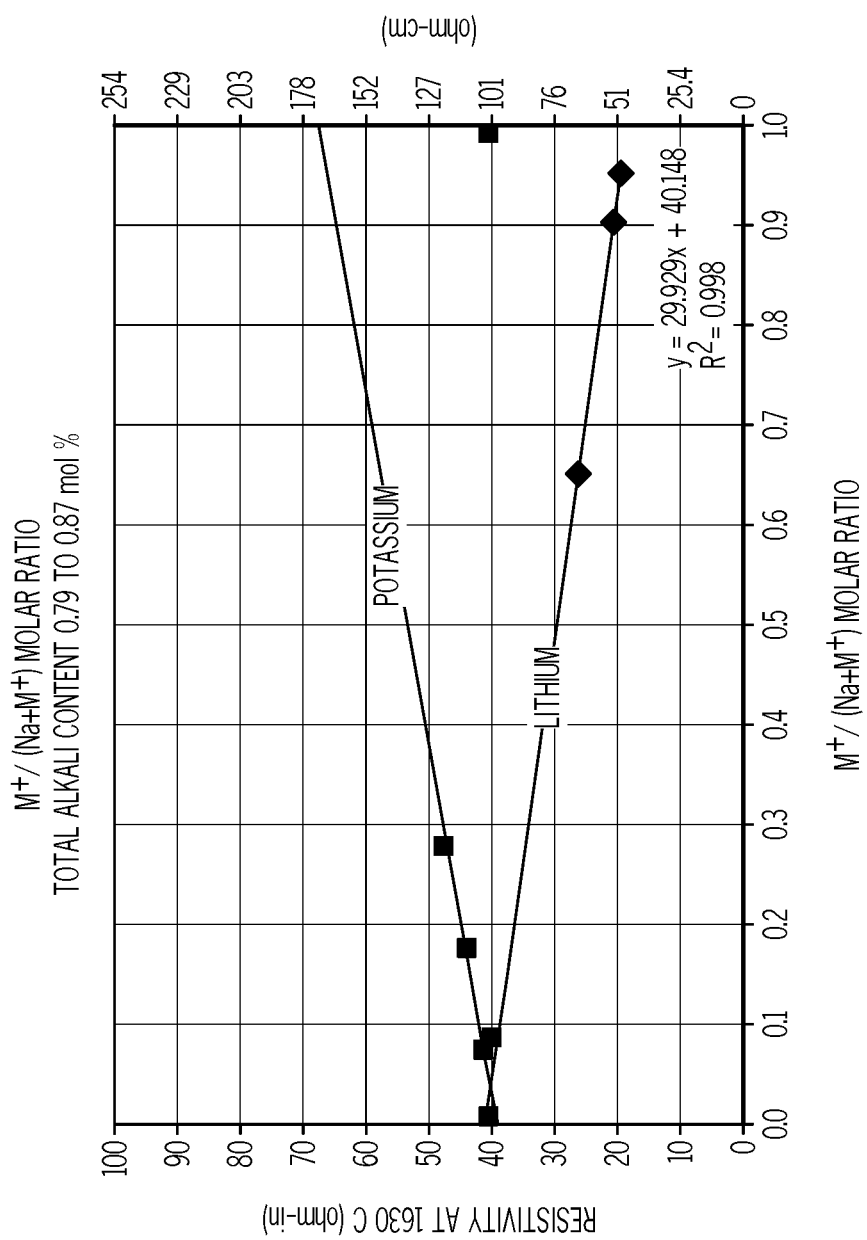
FIG. 2 graphically depicts the high temperature resistivity of a glass as a function of the potassium or lithium content of the glass expressed in terms of the ratio of $M^+:(Na^++M^+)$, where M is $Li^+$ or $K^+$.

For the compositions described herein, at melting temperatures, no mixed alkali effect is oberserved in the glass because the glass is a liquid and the cations ($Li^+$, $K^+$) can move freely to conduct. The smaller ions (e.g., $Li^+$) are more conductive than the large ions (e.g., $K^+$). Therefore, lithium allows for the lowest voltages at melter temepratures for the same molar percent of alkali metal oxide, compared to the other species. For example, as shown in FIG. 2, the high temperature resistivity of the glass increases as the molar ratio of $K^+:(Na^++K^+)$ increases. As the molar ratio of $Li^+:(Na^++Li^+)$ increases, the high temperature resistivity of the glass actually decreases. While not wishing to be bound by theory, it is believed that these trends are due to the respective sizes of the alkali metal ions. In particular, it is believed that the larger $K^+$ ions are less mobile in the glass relative to $Na^+$ ions which, in turn, is less mobile relative to $Li^+$ ions. However, the relatively smaller $Li^+$ ions are more mobile in the glass and their mobility increases as the concentration of $Li^+$ ions increases.

Example 2

Figure 3:
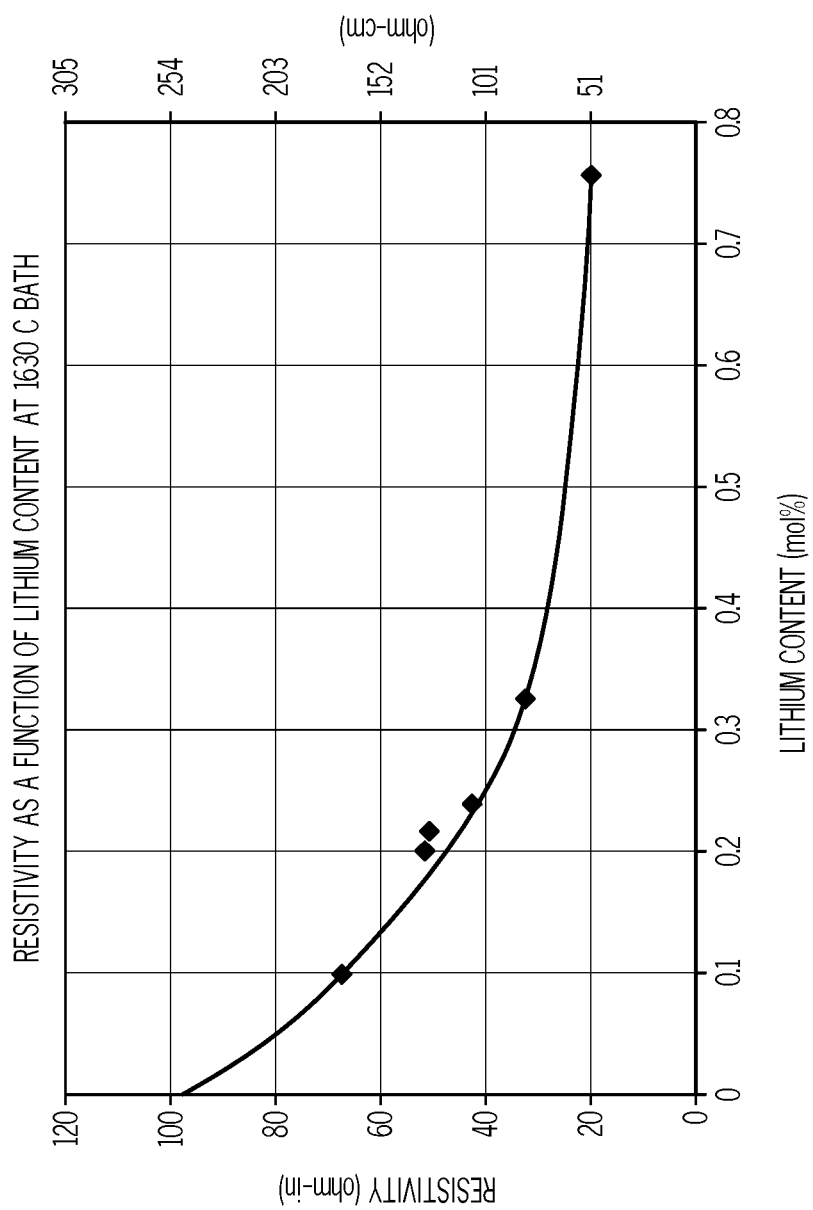
FIG. 3 graphically depicts the high temperature resistivity of a glass as a function of the lithium content of the glass.

To investigate the effect of $Li_2O$ on high temperature resistivity, a glass similar to the glass of the second trial of Example 1 was batched with 0.8 mol. % $Li_2O$ and no other alkali metal oxide. The $Li_2O$ concentration was decreased in the melter from 0.8 mol. % and the operating voltage of the melter was monitored for a fixed current at a temperature of 1630° C. A minimum of 0.21 mol. % of $Li_2O$ was reached in the melter. To investigate lithium concentrations less than 0.21 mol. %, crucible melts were made of the glass with 0.2 mol. %, 0.1 mol. % and 0.0 mol % $Li_2O$ and the resistivity tested at 1630° C. The resistivity data for all samples (i.e., 0.8 mol. %→0.0 mol. % $Li_2O$) are plotted in FIG. 3. As shown in FIG. 3, the high temperature resistivity of the glass increased as the concentration of $Li_2O$ in the glass was decreased from 0.8 mol. %, indicating that the glass is more readily meltable with higher concentrations of $Li_2O$.

Example 3

The resistivity of glasses was also investigated at lower temperatures where the glass was in solid form. Specifically, the resistivity of glasses was assessed at temperatures of 250° C., 300° C., 400° C., and 500° C. The glass tested had a similar composition as the base glass described in Example 1 with 0.1 mol. % $Na_2O$. $Na_2O$ was incrementally replaced with $Li_2O$ and the resistivity of the glass was measured at the indicated temperatures. The results of the testing are graphically depicted in FIG. 4. Specifically the resistivity of the glass at the indicated temperatures is plotted as a function of the molar ratio of $Li^+:(Li^++Na^+)$.

Figure 4:
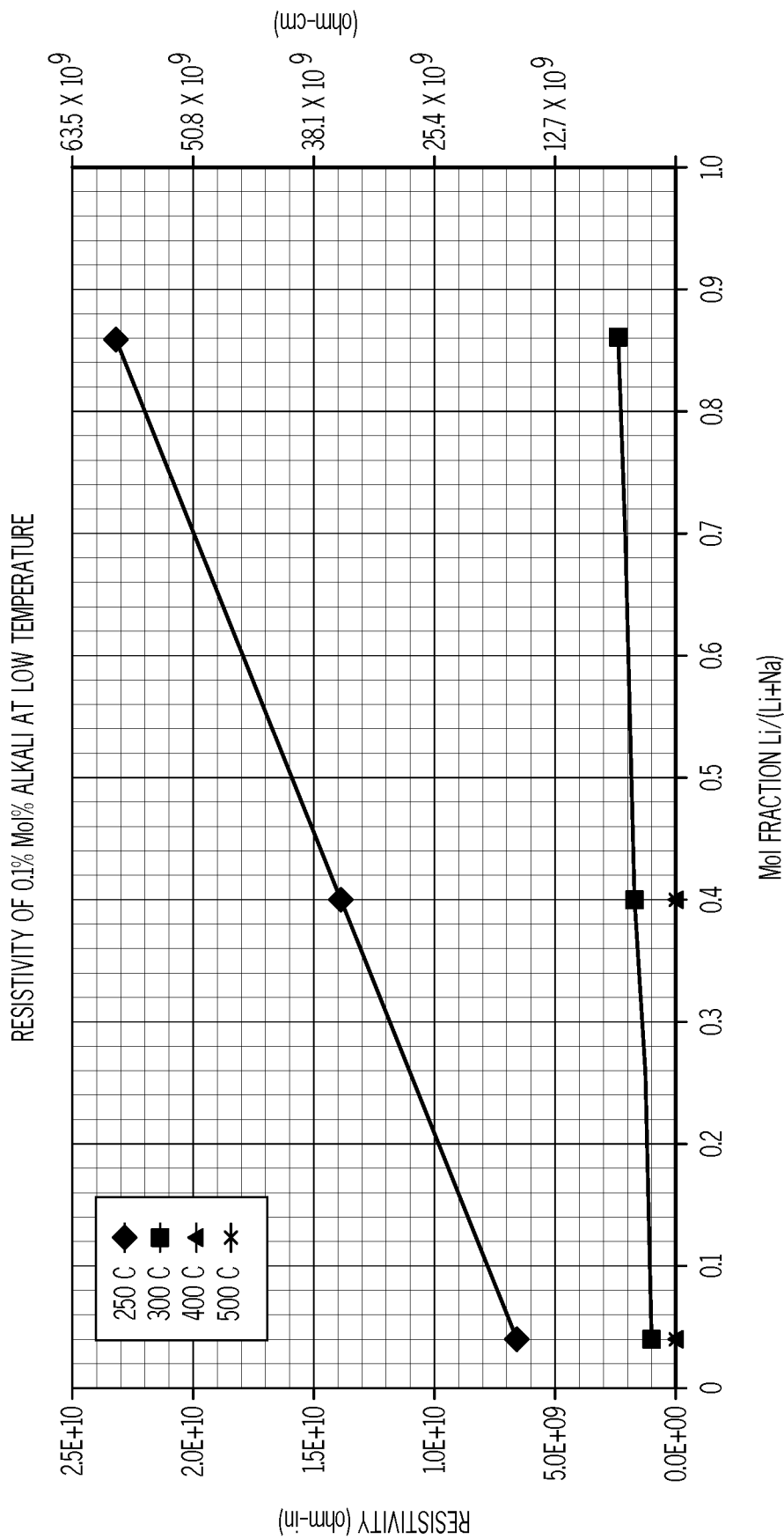
FIG. 4 graphically depicts the low temperature resistivity of the glass as a function of lithium content expressed in terms of the ratio of $Li^+:(Na^++Li^+)$.
Figure 5:
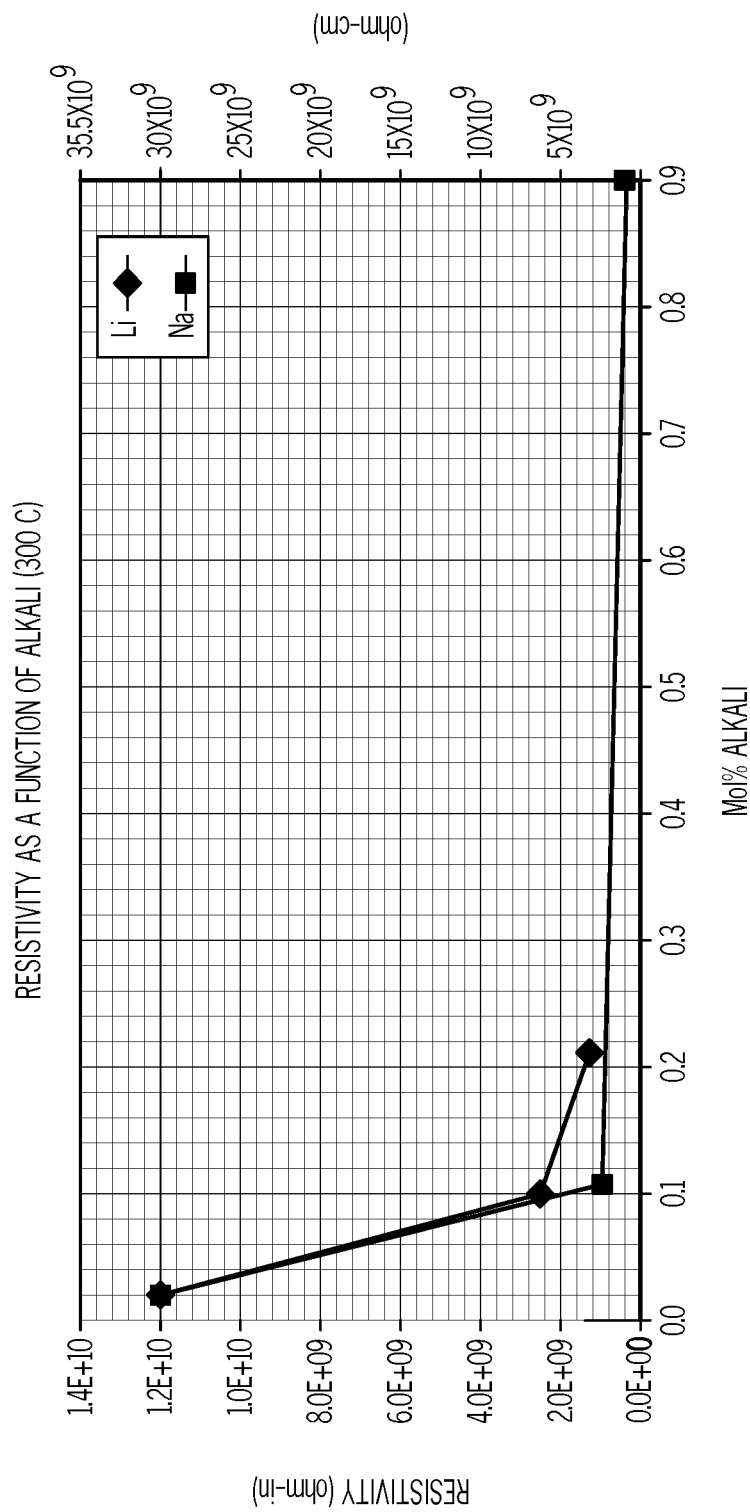
FIG. 5 graphically depicts the resistivity at 300° C. as a function of alkali metal oxide content.

It was expected that the mixture of $Li_2O$ and $Na_2O$ in the glass would lower the resistivity due to a mixed alkali effect. However, as shown in FIG. 4, at lower temperatures (i.e., at 250° C. and 300° C.) it was unexpectedly found that the resistivity of the glass actually increased as the molar ratio of $Li^+:(Li^++Na^+)$ increased. That is, the glasses did not exhibit a mixed alkali effect at these temperatures, which was unexpected as such an effect is well documented in silicate glasses. Indeed, separately plotting the resistivity of the glass at 300° C. as a function of the concentration of $Li_2O$ and the concentration of $Na_2O$ (FIG. 5) showed that the glasses containing $Li_2O$ actually had greater resistivity than the glass containing the same concentration of $Na_2O$, which was also unexpected given the greater mobility of lithium ions in the glass compared to sodium ions.

Example 4

The Young's modulus and hardness for glasses with different ratios of $Li_2O$ and $Na_2O$ were investigated. Specifically, the base glass composition of Example 1 was modified with varying ratios of $Li_2O:(Li_2O+Na_2O)$ and the Young's modulus and hardness were determined. The total alkali metal oxide content was 0.86 mol. %. The results are graphically depicted in FIG. 6 with the Young's modulus (E) and the hardness (H) plotted as a function of the ratio of $Li_2O:(Li_2O+Na_2O)$ in the glass.

Figure 6:
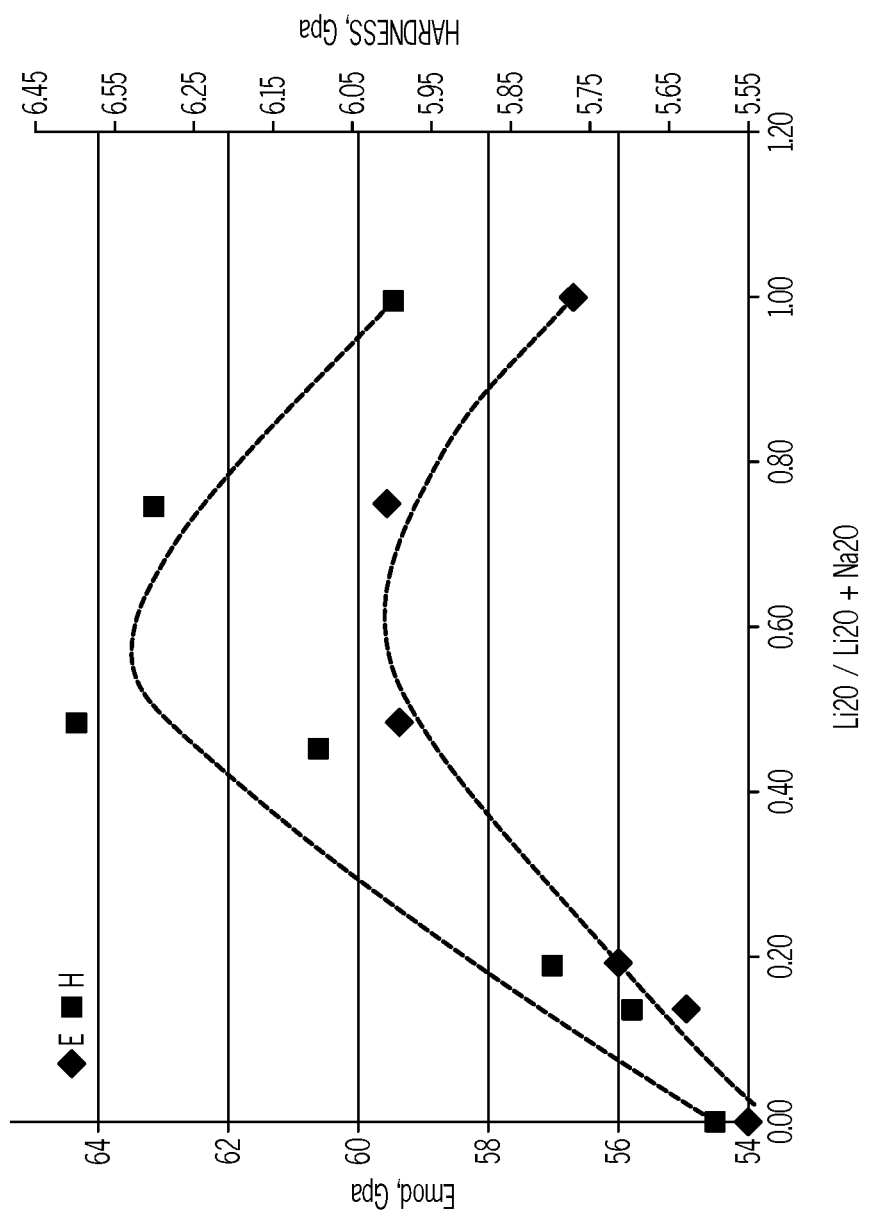
FIG. 6 graphically depicts the Young's modulus and hardness of glasses as a function of the ratio of $Li_2O:(Li_2O+Na_2O)$.

As shown in FIG. 6, both the Young's modulus and the hardness exhibited a roughly parabolic behavior with respect to the ratio of $Li_2O:(Li_2O+Na_2O)$. The data indicates that the mechanical properties of the glass may be tailored by adjusting the relative concentrations of $Li_2O$ and $Na_2O$ while maintaining the same total alkali metal oxide content.

Figure 7:
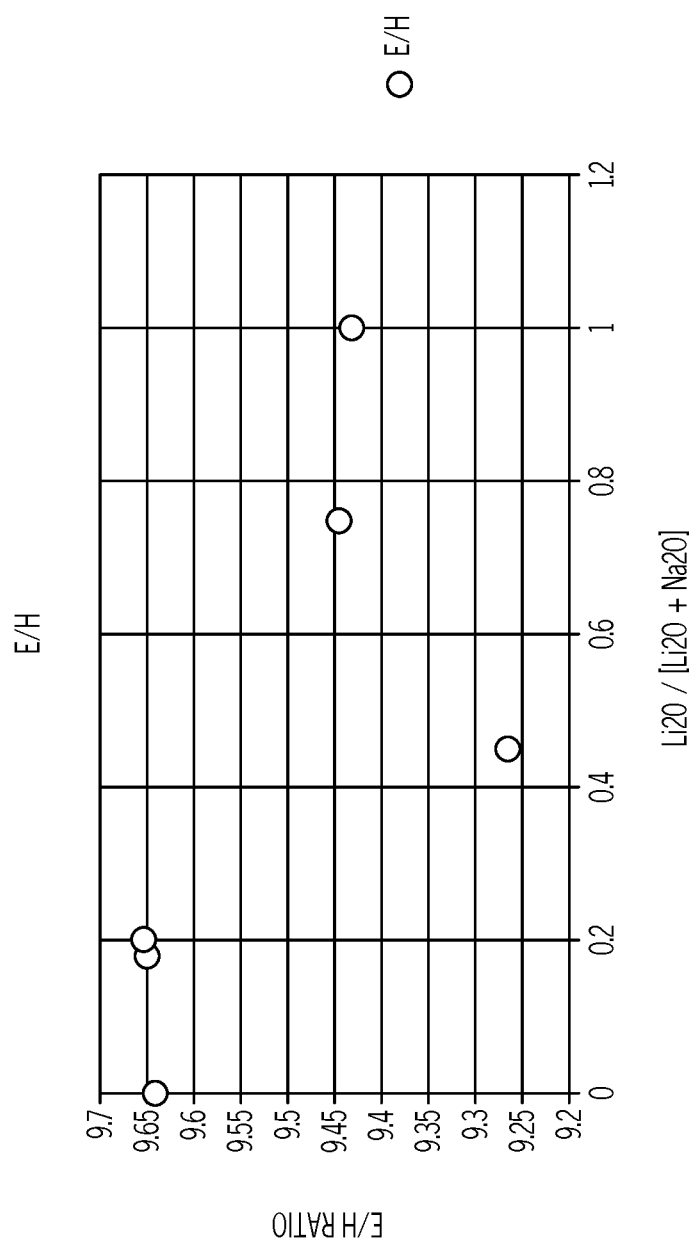
FIG. 7 graphically depicts the ratio of the Young's modulus to hardness of glasses as a function of $Li_2O:(Li_2O+Na_2O)$.
Figure 8:
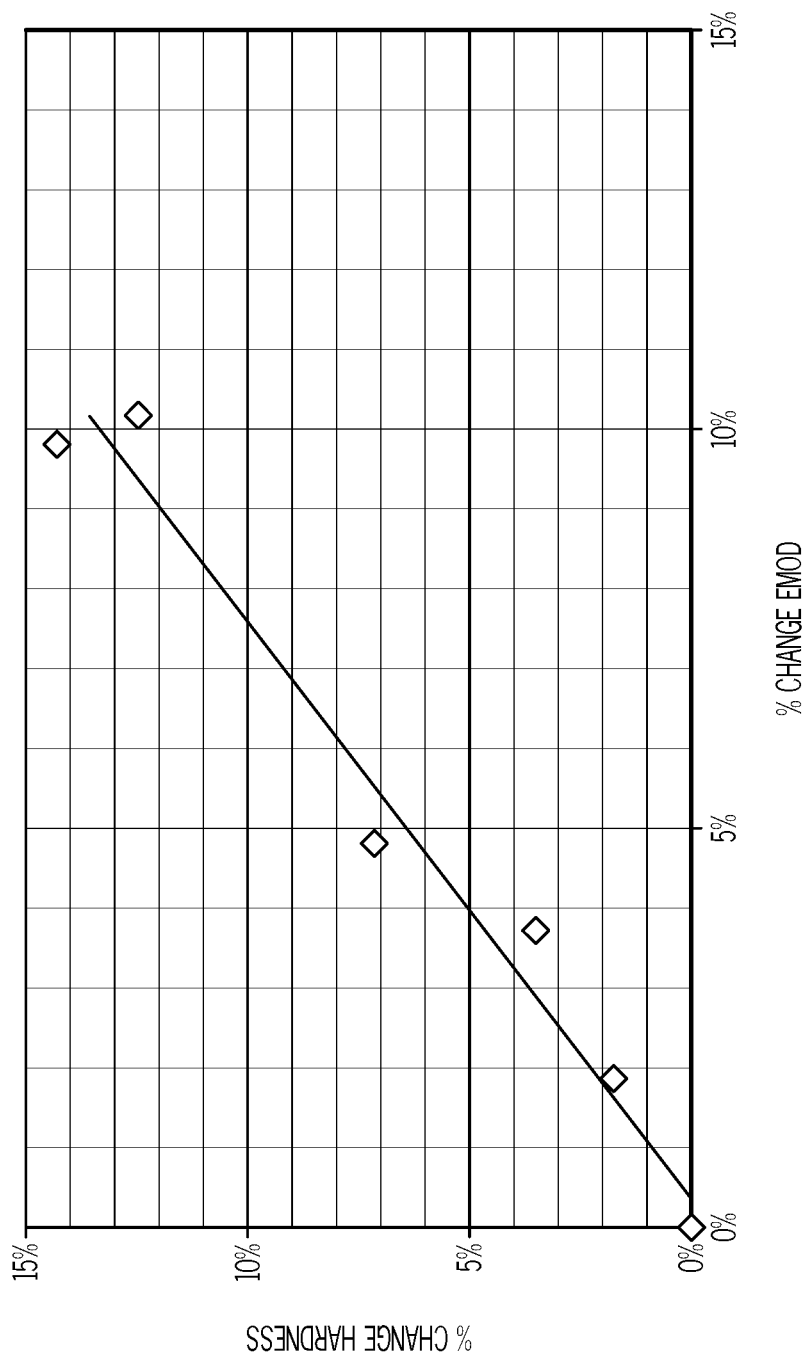
FIG. 8 graphically depicts the change in the hardness for a lithium containing glass as a function of the change in the Young's modulus.

For example, FIG. 7 graphically depicts the ratio of the Young's modulus to the hardness for various values of the ratio of $Li_2O:(Li_2O+Na_2O)$ showing that the ratio of Young's modulus to the hardness decreases as the concentration of $Li_2O$ is increased for the same total alkali metal oxide concentration in the glass. FIG. 8 shows the % change in the hardness as a function of the % change in the Young's modulus based on compositional variations of the alkali metal oxide. This data demonstrates that the mechanical properties of the glass can be tailored by adjusting the relative concentrations of $Li_2O$ and $Na_2O$ in the glass while maintaining the total alkali metal oxide concentration. For example, by increasing the $Li_2O$ concentration to 40% of the total alkali metal oxide concentration (keeping the total alkali metal oxide concentration constant), it is possible to increase the hardness by about 14% while only increasing the Young's modulus by 10%, yielding a glass that has an unexpectedly high hardness.

A method of making the glasses described herein is also provided. The method includes providing a glass melt comprising $SiO_2$, $B_2O_3$, $Al_2O_3$, alkali metal oxide comprising at least $Li_2O$, and divalent oxides. The glass melt is down-drawn to form the glass. In some embodiments, the step of down-drawing the glass comprises slot-drawing the glass melt and, in other embodiments, fusion-drawing the glass melt.

In certain embodiments, the method further includes providing a core glass melt and fusion drawing the core glass melt to form a core glass having a coefficient of thermal expansion that is less than the coefficient of thermal expansion of the clad glass. The clad glass melt is then fusion drawn to form the clad glass layer and fused to the core glass to form a glass laminate. The clad glass layer is under a compressive stress of at least about 40 MPa and, in some embodiments, at least about 80 MPa.

The relatively high resistivity of the glasses described herein at temperatures in the range from about 250° C. to 500° C. make the glasses suitable for use as a substrate in thin film transistor (TFT) display applications. The relatively high resistivity of the glasses at temperatures in the range from about 250° C. to 500° C. mitigate the migration of alkali ions into the TFTs, thereby preventing damage to the TFTs. In some embodiments, the glasses also have high annealing and strain points which reduce thermal compaction, a property that is desirable for TFT display substrates.

The glasses described herein may also be used in color filter substrates, cover glasses, or touch interfaces in various electronic devices.

The glasses and laminates disclosed herein may be incorporated into another article such as an article with a display (or display articles) with or without a thin film transistor (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. For example, a consumer electronic device may including a housing having front, back, and side surfaces; electrical components (not shown) that are at least partially inside or entirely within the housing and including at least a controller, a memory, and a display at or adjacent to the front surface of the housing; and a cover substrate at or over the front surface of the housing such that it is over the display. In some embodiments the consumer electronic device may also include a thin film transistor. In some embodiments, the cover substrate may include any of the glasses or laminates disclosed herein.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass article comprising:
a core glass;
a clad glass fused to the core glass, wherein:
the clad glass comprises from 50 mol. % to 70 mol. % $SiO_2$;
the clad glass comprises from 12 mol. % to 35 mol. % $B_2O_3$;
the clad glass comprises from 4 mol. % to 12 mol. % $Al_2O_3$;
the clad glass comprises alkali metal oxide, the alkali metal oxide comprising at least one of $Na_2O$, $Li_2O$, and $K_2O$, wherein $Na_2O$ and/or $Li_2O$ is from 0.3 mol. % to 0.6 mol. % in the clad glass, $Li_2O$ is greater than or equal to 20% of the alkali metal oxide in the clad glass, the ratio of $Li_2O$ (mol. %) to ($Li_2O$ (mol. %)+$Na_2O$ (mol. %)) in the clad glass is greater than or equal to 0.4 and less than or equal to 0.6, and the total amount of alkali metal oxide in the clad glass is less than or equal to 1 mol. %;
the clad glass comprises greater than 0 mol. % and less than 12 mol. % of total divalent oxide, wherein the total divalent oxide in the clad glass is less than or equal to the concentration of $Al_2O_3$ in the clad glass and includes at least one of CaO, MgO and SrO;
the clad glass has a first coefficient of thermal expansion; and
the core glass has a second coefficient of thermal expansion that is greater than the first coefficient of thermal expansion.

2. The glass article of claim 1, wherein the clad glass has a low temperature resistivity greater than or equal to $1 \times 10^9$ $\Omega$-cm.

3. The glass article of claim 1, wherein the clad glass has a high temperature resistivity less than or equal to 180 $\Omega$-cm.

4. The glass article of claim 1, wherein a concentration of $Li_2O$ in the clad glass is greater than or equal to 40% of the alkali metal oxide.

5. The glass article of claim 1, wherein an elastic modulus of the clad glass is within +/−0.2 of a maximum elastic modulus of the clad glass.

6. The glass article of claim 1, wherein the clad glass is under a compressive stress of at least 40 MPa.

7. A consumer electronic product, comprising:
a housing having a front surface, a back surface and side surfaces;
electrical components provide at least partially within the housing; and
the glass article of claim 1 disposed over the display.

8. A glass article comprising:
a core glass;
a clad glass fused to the core glass, wherein:
the clad glass comprises from 50 mol. % to 70 mol. % $SiO_2$;
the clad glass comprises from 12 mol. % to 35 mol. % $B_2O_3$;
the clad glass comprises from 4 mol. % to 12 mol. % $Al_2O_3$;
the clad glass comprises alkali metal oxide, wherein the alkali metal oxide comprises from 0.2 mol. % to 0.7 mol. % $K_2O$, $Li_2O$ is greater than or equal to 20% of the alkali metal oxide in the clad glass, the ratio of $Li_2O$ (mol. %) to ($Li_2O$ (mol. %)+$Na_2O$ (mol. %)) in the clad glass is greater than or equal 0.4 and less than or equal to 0.6, and the total amount of alkali metal oxide in the clad glass in less than or equal to 1 mol. %;
the clad glass comprises greater than 0 mol. % and less than 12 mol. % of total divalent oxide, wherein the total divalent oxide in the clad glass is less than or equal to the concentration of $Al_2O_3$ in the clad glass and includes at least one of CaO, MgO and SrO;
the clad glass has a first coefficient of thermal expansion; and
the core glass has a second coefficient of thermal expansion that is greater than the first coefficient of thermal expansion.

9. The glass article of claim 8, wherein the clad glass has a low temperature resistivity greater than or equal to $1 \times 10^9$ $\Omega$-cm.

10. The glass article of claim 8, wherein the clad glass has a high temperature resistivity less than or equal to 180 $\Omega$-cm.

11. The glass article of claim 8, wherein the clad glass has a coefficient of thermal expansion of less than $40 \times 10^{-7}$/° C. and a Young's modulus of less than 65 GPa.

12. The glass article of claim 8, wherein the clad glass has a liquidus viscosity greater than or equal to 100 kP.

13. The glass article of claim 8, wherein a concentration of $Li_2O$ in the clad glass is greater than or equal to 40% of the alkali metal oxide in the clad glass.

14. The glass article of claim 8, wherein the clad glass comprises less than or equal to 0.5 mol. % alkali metal oxide.

15. A consumer electronic product, comprising:
a housing having a front surface, a back surface and side surfaces;
electrical components provide at least partially within the housing; and
the glass article of claim 8 disposed over the display.

* * * * *